(12) United States Patent
Caruso et al.

(10) Patent No.: US 7,368,794 B2
(45) Date of Patent: May 6, 2008

(54) BORON CARBIDE PARTICLE DETECTORS

(76) Inventors: Anthony N. Caruso, 328 Liberty La., Horace, ND (US) 58047; Peter A. Dowben, c/o Board of Regents of University of Nebraska, 3835 Holdrege St., Lincoln, NE (US) 68588; Jennifer I. Brand, c/o Board of Regents of University of Nebraska, 3835 Holdrege St., Lincoln, NE (US) 68588

( * ) Notice: Subject to any disclaimer, the term of this patent is extended or adjusted under 35 U.S.C. 154(b) by 5 days.

(21) Appl. No.: 11/195,407

(22) Filed: Aug. 2, 2005

(65) Prior Publication Data

US 2006/0131589 A1    Jun. 22, 2006

Related U.S. Application Data

(60) Provisional application No. 60/598,142, filed on Aug. 2, 2004, provisional application No. 60/604,727, filed on Aug. 26, 2004.

(51) Int. Cl.
*H01L 31/115*    (2006.01)

(52) U.S. Cl. .................... 257/428; 257/429; 257/78; 438/56

(58) Field of Classification Search .................. 257/77, 257/428, 429, E21.329, E31.089, 473
See application file for complete search history.

(56) References Cited

U.S. PATENT DOCUMENTS

| | | | | |
|---|---|---|---|---|
| 4,697,203 | A | * | 9/1987 | Sakai et al. .................. 257/681 |
| 5,658,834 | A | * | 8/1997 | Dowben ...................... 438/478 |
| 5,940,460 | A | * | 8/1999 | Seidel et al. ................. 376/153 |
| 6,771,730 | B1 | * | 8/2004 | Dowben et al. ............. 376/155 |
| 6,774,013 | B2 | | 8/2004 | Dowben et al. |

FOREIGN PATENT DOCUMENTS

WO    WO 00/33106    *    6/2000

OTHER PUBLICATIONS

Caruso et al., The heteroisomeric Diode, Journal of Physics: Condensed Matter 16 (2004) Feb. 27, 2004 pp. L139-L146.*
Caruso et al., "The Heteroisomeric Diode," Journal of Physics—Condensed Matter, Feb. 27, 2004.*

* cited by examiner

*Primary Examiner*—Zandra V. Smith
*Assistant Examiner*—Paul E Patton
(74) *Attorney, Agent, or Firm*—Shook, Hardy & Bacon LLP

(57) ABSTRACT

Boron carbide heteroisomer semiconductor devices are used as particle detectors. The boron carbide semiconductor devices produce electric current in response to incident particles, such as alpha particles, neutrons, or photons.

7 Claims, 8 Drawing Sheets

BORON CARBIDE PARTICLE DETECTORS

CROSS REFERENCE TO RELATED APPLICATIONS

This application claims priority under 35 U.S.C. § 119(e) from Provisional U.S. Patent Application 60/598,142, filed on Aug. 2, 2004, and Provisional U.S. Patent Application 60/604,727, filed on Aug. 26, 2004.

STATEMENT REGARDING FEDERALLY SPONSORED RESEARCH OR DEVELOPMENT

The Board of Regents of the University of Nebraska acknowledges that some funding for the research leading to this application was provided by the United States Government under Contract/Sponsor/Grant NSF #EPS-9901900 and NSF CHE-0346501.

TECHNICAL FIELD

This invention is directed devices for generating electrical current based on incident particles. More particularly, the present invention is directed to boron carbide devices for generating electrical current based on incident particles.

BACKGROUND OF THE INVENTION

Both p and n type semiconducting materials are commonly used to form semiconducting devices. A p-n junction diode is a typical example of a device containing such a junction between a p and n type material. The diode can be constructed by forming an interface or junction between a semiconducting material having holes as the majority carrier (the "p" material) and a semiconducting material having electrons as the majority carrier (the "n" material). In addition to single junction devices, multiple junctions can be formed consecutively to form other devices, such as p-n-p or n-p-n transistors. Known semiconducting materials suitable for use in forming p-n junctions include silicon, germanium, gallium arsenide, and boron carbide.

Conventionally, p-n junction devices can be formed as either heterojunction devices or homojunction devices. In heterojunction devices, two different semiconductor materials are selected to form a p-n junction. Based on the selection of materials, devices with various bias voltages can be created. Strain can be created at interfaces of dissimilar material, which can lead to structural defect failure. Different materials also have diffusion across the interface or side reactions leading to an al together different semiconductor, which can lead to eventual failure increased recombination for electron hole pairs.

In homojunction devices, the same bulk semiconductor material is used to form both halves of the p-n junction, but one or more dopants are added to one or both sides of the junction in order to modify the majority carrier. Homojunction devices typically have little or no strain at the junction interface. Due to fabrication difficulties and interdiffusion effects, however, it is difficult to create a sharp transition between the p and n materials. Devices with non-abrupt transitions between the p and n materials typically suffer from increased recombination at the p-n junction. Additionally, doping of the semiconductor materials can lead to introduction of other impurities, and some impurities may be activated by the incident radiation, particularly neutrons.

Heterojunction and homojunction devices, such as diodes, are useful for a myriad of applications. Heteroisomeric devices in accordance with the present invention are a new type of device that may find application in any of the myriad of uses where heterojunction and homojunction devices are employed, as well as new uses for which heterojunction and homojunction devices are ill-suited. One area of particular interest for heteroisomeric diodes is the conversion of the kinetic energy of particles incident upon them to signal pulses, thereby allowing electrical pulses to indicate particles incident upon the devices What is needed are p-n junction devices that are effective for detection of incident particles. The devices should be capable of withstanding a variety of operating environments. The devices should be constructed of materials with a high neutron capture cross-section, and significant capture cross-section for other incident particles of interest, as well as stability against radiation damage.

SUMMARY OF THE INVENTION

In an embodiment, the invention provides a particle detector. The particle detector includes a boron carbide semiconductor device having at least one heteroisomer junction. The detector also includes an electrical connector for transmitting a signal generated by the boron carbide semiconductor device.

In another embodiment, the invention provides a particle detector that contains a plurality of boron carbide semiconductor devices. Each of the boron carbide semiconductor devices includes at least one heteroisomer junction. The device also includes electrical connections between the boron carbide devices so that each boron carbide device is electrically connected to at least one other boron carbide device. Additionally, the detector includes at least one electrical connector for transmitting a signal generated by one or more of the boron carbide semiconductor devices.

The use of boron carbide provides numerous advantages. Boron carbide is extremely hard and durable, and is resistant to high temperatures, harsh conditions and radiation damage. As a result, boron carbide may find application in environments not suitable for other semiconductor materials.

DETAILED DESCRIPTION OF THE EMBODIMENTS

I. Heteroisomer Junctions of Semiconductor Materials

Figure 1:
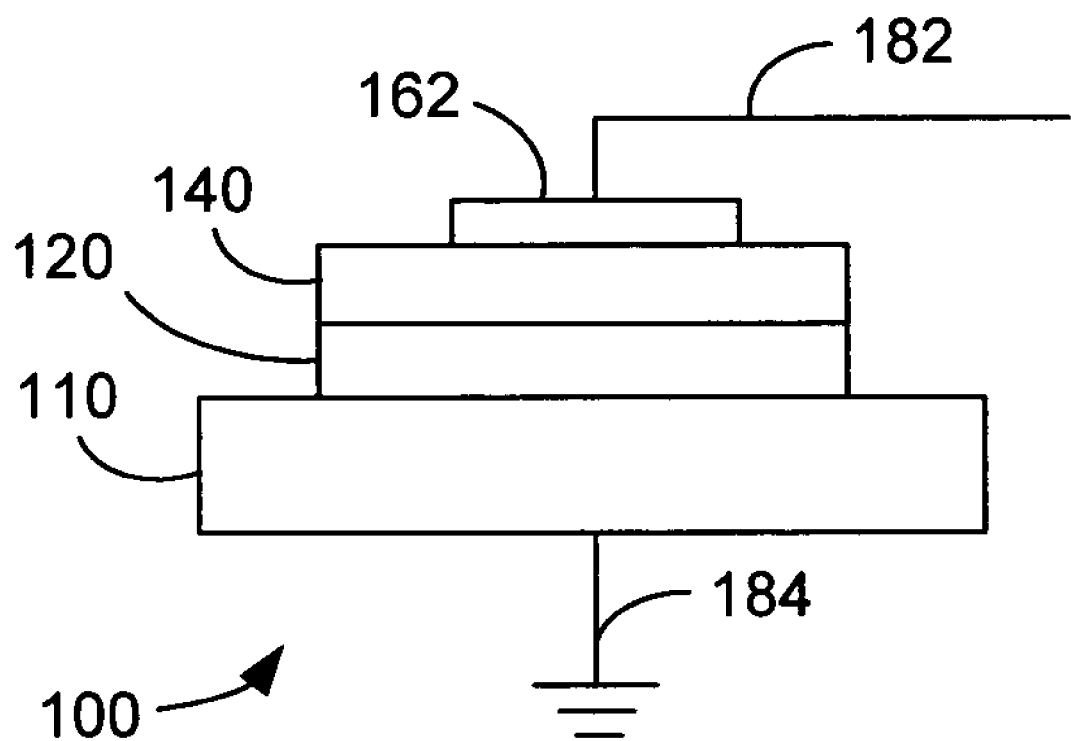
FIG. 1 schematically depicts a diode according to an embodiment of the invention.

The present invention provides semiconductor devices, including boron carbide devices, with heteroisomeric junctions or interfaces of semiconductor materials. A heteroisomeric junction can be created by forming an interface between two semiconductor materials having the same numbers of each kind of atom in the unit cell or "building block" (stoichiometry) but a different atomic arrangement within the unit cell or "building block" and this can be accomplished using different source molecules in the chemical vapor deposition process. In various embodiments, boron carbide semiconductor devices, such as a diodes and/or transistors, can be incorporated into devices for directly generating electrical current in response to incident particles. The incident particles can include photons, alpha particles, beta particles, and neutrons. The conversion to electrical energy does not require any intermediate energy conversion steps, such as conversion of energy to steam to drive a turbine for generating electricity.

Because boron carbide semiconductor structures are solid state devices, electric current or power generators based on boron carbide semiconductor structures require no moving parts. This creates the potential for a current generator with a long product lifetime and little or no requirement for maintenance. As a result, boron carbide power generation devices would be advantageous as power sources in remote locations, such as unmanned spacecraft, or in other harsh/remote environments where repairs might not be easily made.

A heteroisomeric junction can be created by forming an interface between two semiconductor materials having the same stoichiometry but a different atomic arrangement. One example of a semiconductor device in accordance with the present invention is a boron carbide diode formed from two boron carbide isomers that have the same stoichiometry and lattice structure but a different atomic arrangement. Because the two boron carbide structures have the same stoichiometry and lattice structure, there is little or no strain at the diode interface. However, the different atomic arrangement of the two boron carbide isomers results in differing electronic properties. This allows a p-n junction to be formed without having to incorporate dopants or other impurities into the boron carbide structures.

II. Fabrication of Boron Carbide Heteroisomer Junctions

A. Semiconductor and Substrate Materials

A boron carbide heteroisomer diode can be constructed by using two carborane isomers having the chemical composition $C_2B_{10}H_{12}$ as precursors. In diodes formed according to embodiments of this invention, orthocarborane, or closo-1,2-dicarbadodecaborane, can be used as a precursor for p-type material. Metacarborane, or closo-1,7-dicarbadodecaborane, can be used as a precursor for n-type material.

In another embodiment, other materials may be used to construct a boron carbide diode. Paracarborane, or closo-1,2-dicarbadodecaborane, can be used as a precursor for n-type material in a boron carbide diode. Another isomer of phospha-carbadodecaborane or other boron based cage molecule may be used as a precursor for p-type material in a boron carbide diode.

In an embodiment, boron carbide heteroisomer devices can be formed by depositing two or more boron carbide isomer layers on a substrate. One technique for depositing a boron carbide film on a metal substrate is plasma-enhanced chemical vapor deposition (PECVD). In PECVD, the precursor molecule or molecules for forming a desired film, as well as one or more optional inert atoms or molecules, are exposed to an energy source (such as microwave energy) to form a plasma. In an embodiment, the plasma used for depositing a layer of a boron carbide diode is formed using a single precursor, such as orthocarborane or metacarborane. In addition to the precursors, the gas used to form the plasma can also contain one or more inert gases, such as argon.

B. Forming a Boron Carbide Device

FIG. 1 schematically shows an example of a boron carbide diode according to an embodiment of the invention. In FIG. 1, a diode 100 is formed on a metal substrate 110. A p-type layer 120 is formed on the surface of substrate 110. An n-type layer 130 resides on top of p-type layer 120. An electrical contact 140 is attached to n-type layer 130, to allow the diode to be electrically connected within a device. In the embodiment shown in FIG. 1, substrate 110 is shown connected to ground 184, while electrical contact 140 is shown connected to connecting line 182. This represents a configuration suitable for testing the properties of the diode. Alternatively, the connection to ground 184 can be replaced with another connecting line 182, to allow the diode to be a part of a circuit. Note that in an alternative embodiment, the position of p-type layer 120 and n-type layer 130 can be reversed, so that n-type layer 130 is adjacent to the substrate. In such an embodiment, electrical contact 140 is attached to p-type layer 120.

Figure 2:
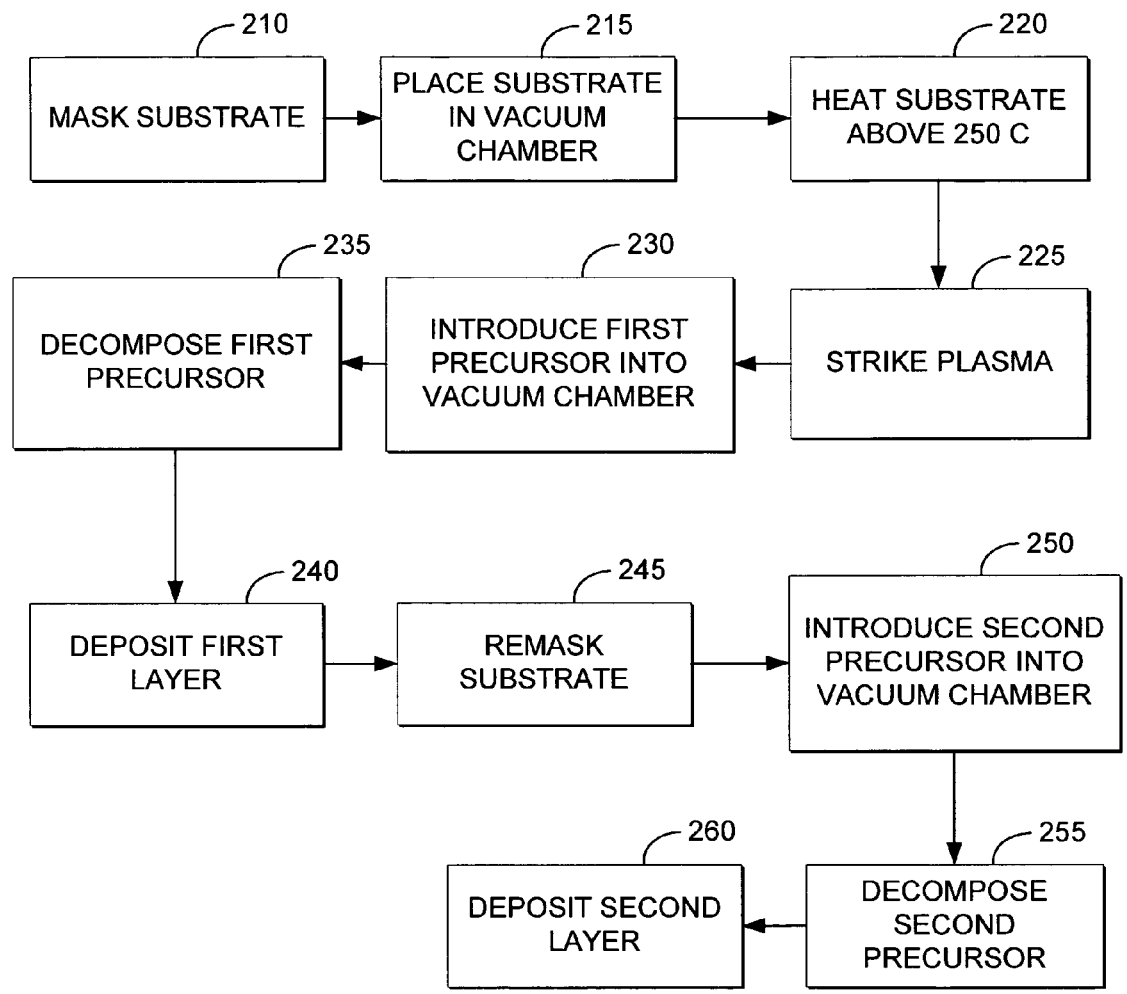
FIG. 2 depicts a process flow for forming heteroisomer junction devices according to an embodiment of the invention.

In an embodiment, a PECVD technique can be used to form a boron carbide heteroisomer junction device. FIG. 2 shows a method for forming a heteroisomer junction diode according to an embodiment of the invention. In describing the process shown in FIG. 2, the formation of a p-n junction diode on a metal substrate will be used as an example, with the p-type layer residing on the substrate and the n-type layer residing on top of the p-type layer. However, similar techniques can be used to construct a diode where the n-type layer resides on the substrate, and the p-type layer resides on the n-type layer.

In the embodiment shown in FIG. 2, the method 200 begins by masking 210 a substrate that the diode will be formed on. One skilled in the art will appreciate that the step of masking 210 may use different techniques and may even be omitted entirely, dependent upon the particular needs and objectives of the user. Any convenient material can be used as the substrate. In a preferred embodiment, the substrate is composed of aluminum, nickel, gold, silver, copper, or cobalt substrate, although any other substrate may be used. The masked and appropriately clean substrate is then placed in a vacuum chamber 215. After placing the substrate in the vacuum chamber, the substrate may be heated 220 prior to deposition. Preferably, the substrate is heated to a temperature of 250° C. or higher, although heating 220 is optional.

A plasma, such as argon, is struck 225 in the PECVD chamber. The first precursor is introduced 230 into the chamber. The first precursor decomposes 235 in reaction to the plasma and is deposited 240 on the substrate. One skilled in the art will appreciate that the thickness of the layer deposited may be controlled by controlling the amount of the first precursor introduced into the chamber. To form p-n junction with the p-material residing on the substrate, orthocarborane can be selected as the first precursor. However, the metacarborane or paracarborane could be used as the first precursor so that an n-type layer is deposited on the substrate.

After forming the first layer on the substrate, a second layer is formed on top of the first layer. In an example where the first layer was a p-type layer formed using orthocarborane as a precursor, the second layer can be formed using a precursor suitable for forming an n-type layer, such as metacarborane or paracarborane. To deposit the second layer, the substrate may be remasked 245, if desired. A second precursor is introduced 250 into the processing chamber. The second precursor decomposes 255 in reaction to the plasma and is deposited 260 on the first layer to form a second layer. One skilled in the art will appreciate that the thickness of the second layer may be controlled by controlling the amount of the second precursor introduced into the chamber. After forming the second layer, the device may be returned to ambient temperature 270 and removed from the PECVD chamber.

While method 200 is directed to the use of PECVD, one skilled in the art will appreciate that other semiconductor fabrications techniques may be used. For example, the precursors may be deposited and the decomposed, for example using radiation such as x-rays or electrons.

After forming a heteroisomer junction device, one or more electrical connections, such as bonding pads, can be attached to the exposed surfaces of the semiconductor layers. One skilled in the art will appreciate that all or part of method 200 may be repeated to form other devices, such as transistors, by depositing additional layers of isomers. Likewise, further semiconductor techniques may be used before, during, or after method 200 to fabricate other circuit components for use in conjunction with the heteroisomeric device(s) created using method 200. The bonding pad can be composed of the same material as the substrate, or another suitable conductive material. The bonding pad allows a heteroisomer junction device to be electrically connected as a component in an electric circuit. In an embodiment where the heteroisomer junction device is a transistor, the electrical connection can be in either the form of a bonding pad (for the source or drain) or a gate bonding pad (for the gate of the transistor). In another embodiment, a heteroisomer junction device deposited on a conducting substrate can use the substrate for forming electrical connections.

C. Composition of Boron Carbide Layers

Figure 5:
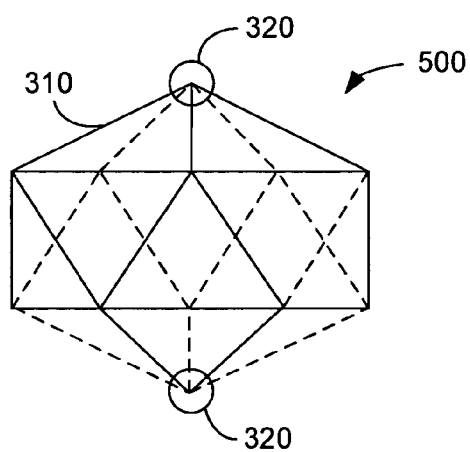
FIG. 5 schematically depicts para boron carbide.
Figure 4:
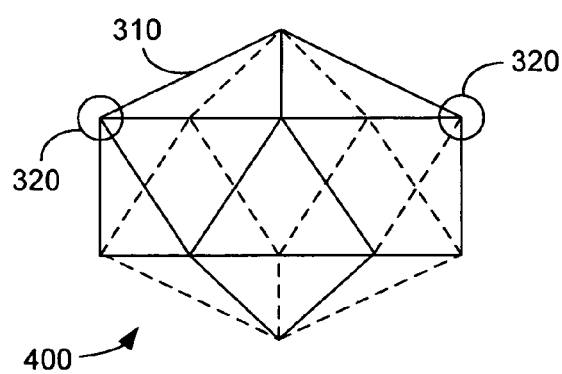
FIG. 4 schematically depicts meta boron carbide.
Figure 3:
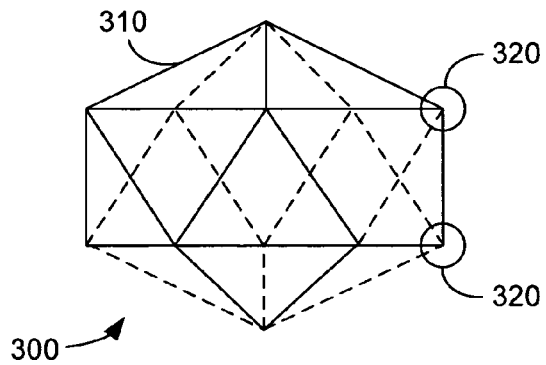
FIG. 3 schematically depicts ortho boron carbide.

Method 200 shown in FIG. 2 is one way to produce heteroisomer junction devices. FIGS. 3 to 5 show the cage structures corresponding to the ortho, meta, and para isomers of boron carbide. As shown in FIG. 3, the carbons 320 in orthocarborane 300 are at adjacent atomic locations in the cage. FIG. 4 shows the location of carbons 320 in metacarborane 400, while FIG. 5 shows that the carbons 320 are located at the opposite sides of paracarborane 500.

Note that FIGS. 3 to 5 show only bonds 310 between boron and carbon atoms in the cage structure. In the precursor molecules, additional hydrogens would be attached to the cage to form a stable molecule. Boron carbide as illustrated in FIGS. 3 to 5 may exist stably in thin films, such as may be used to form semiconductor devices. In the semiconducting layers used in embodiments of this invention, the cage structures represent repeating units that are found in the boron carbide layers. The cage structures within a layer will be decomposed in order to form a layer.

Figure 6A:
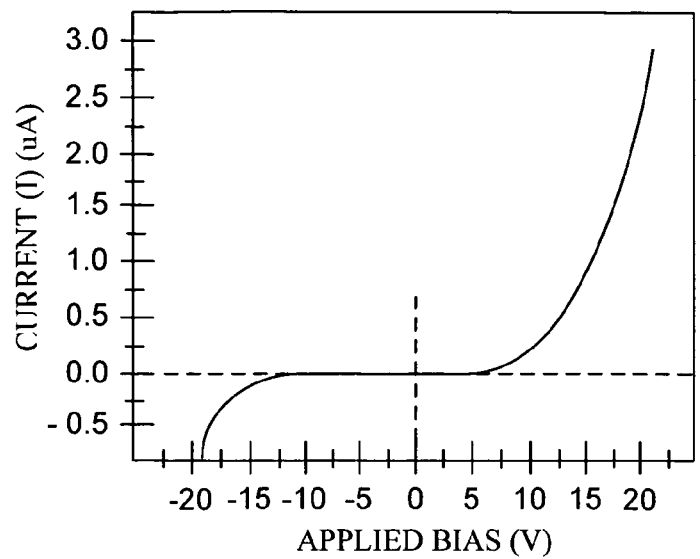
FIGS. 6a, 6b, and 6c depict various properties of boron carbide devices according to an embodiment of the invention.
Figure 6B:
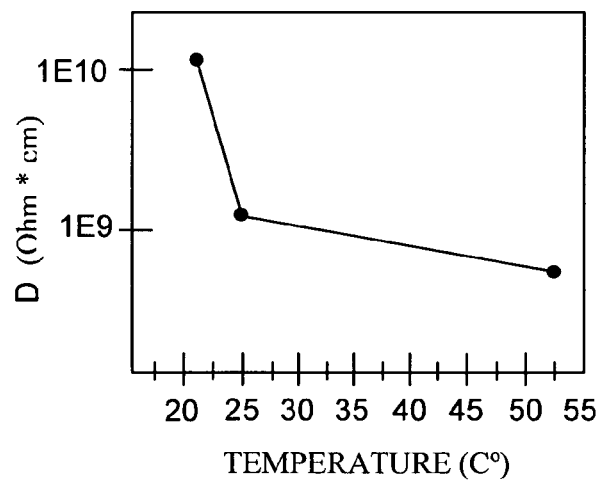

The boron carbide diodes according to various embodiments of the invention have a variety of beneficial properties. FIG. 6a depicts a current versus bias curve for a diode having the configuration shown in FIG. 1, where the substrate is aluminum. As shown in FIG. 6a, the diode used in this example is highly resistive, as indicated by the hysteresis in the diode characteristics. The diode also exhibits only small leakage currents, as shown by the broad plateau near 0 total current for a bias voltages between −5 V and 5 V. The high resistivity of the diode in this example is also shown in FIG. 6b, which depicts the resistivity of the diode as a function of temperature under a reverse bias of 1 V.

Figure 6C:
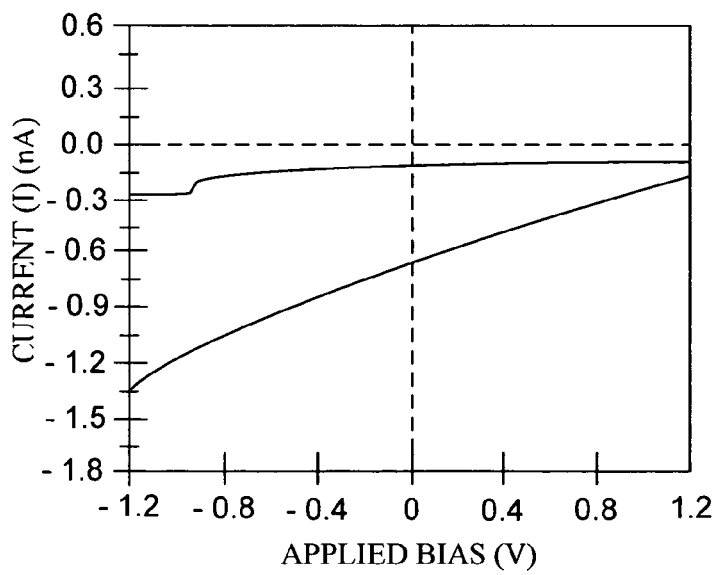

FIG. 6c shows the behavior of the same example diode when in the presence of light. In FIG. 6c, the lower line shows the saturation behavior of the diode when exposed to a light source of sufficient intensity. The upper line shows the recovery of the diode after the diode is no longer exposed to the saturating light.

IV. Additional Boron Carbide Device Structures

Figure 7:
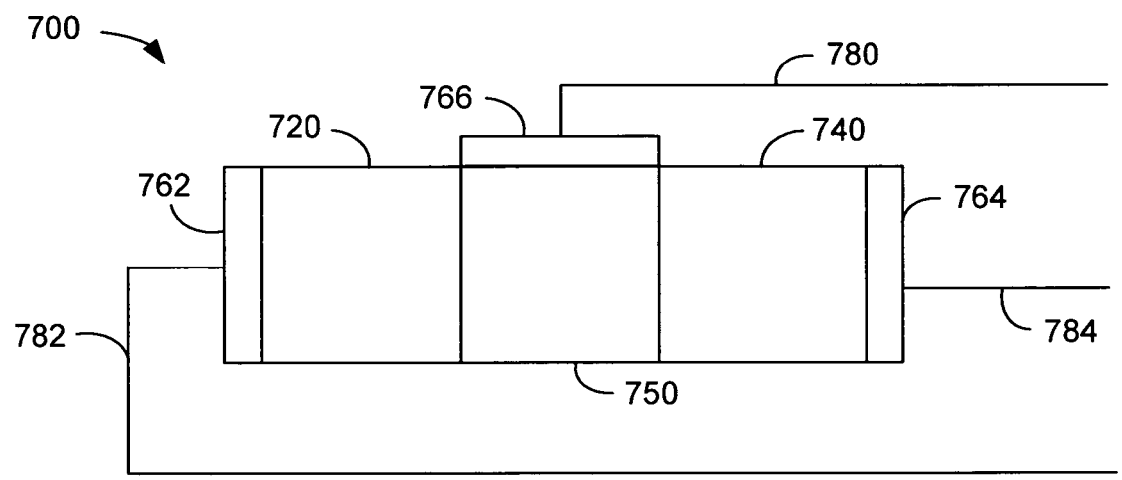
FIG. 7 schematically depicts a transistor in accordance with an embodiment of the invention.

In additional embodiments of the invention, a variety of heteroisomer junction devices can be constructed using heteroisomer p-n junctions. In addition to diodes, transistors can also be constructed, such as p-n-p or n-p-n transistors. FIG. 7 shows an example of a p-n-p or n-p-n transistor structure 700. In an embodiment, a transistor according to the invention can be found by creating an interface by joining a first isomer material 720, a second isomer material 750, and a third isomer material 740. In such an embodiment, the second isomer material 750 serves as the base. A base connection layer 766 or bonding pad is provided to allow electrical connection 780 with a circuit that will provide a threshold voltage for controlling the transistor. Electrical connection layers 762 and 764 allow electrical connections 782 and 784 to be formed with the emitter and collector of the transistor.

In the embodiment shown in FIG. 7, bonding pads 762, 764, and 766 are shown as having the same surface area as the area of the corresponding semiconductor surface. In another embodiment, bonding pads can have a smaller surface area than the corresponding semiconductor surface.

Figure 8:
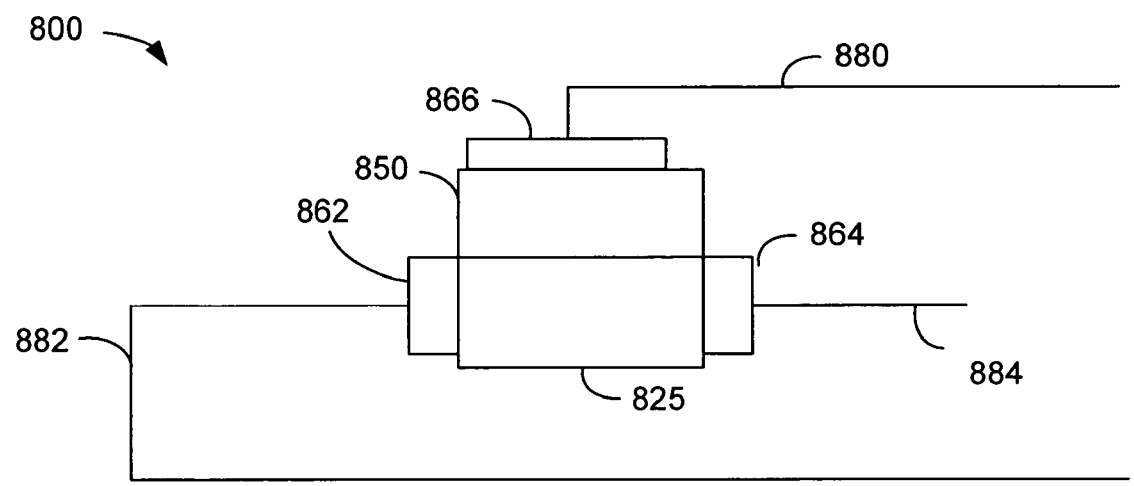
FIG. 8 schematically depicts a transistor in accordance with an embodiment of the invention.

In another embodiment, a transistor can be formed using only a single p-n junction. FIG. 8 shows an example of such an embodiment, where a transistor 800 is formed by creating an interface by joining a first isomer 825 with a second isomer 850. The second isomer material 850 serves as the gate. A gate connection layer 866 or bonding pad is provided to allow electrical connection 880 with a circuit that will provide a gate voltage for controlling the transistor. Electrical connection layers 862 and 864 allow electrical connections 882 and 884 to be formed with two separate surfaces of first isomer 825. In this embodiment, the second isomer layer 850 serves as the gate while the first isomer layer 825 serves as both source and drain.

V. Boron Carbide Devices for Particle Detection

A. Device Features

In an embodiment, boron carbide semiconductor structures can be incorporated into devices for detecting incident particles, such as photons, alpha particles, beta particles, and/or neutron radiation. In addition to being sensitive to a variety of incident particles, in an embodiment the electric current generated in a boron carbide semiconductor device from an incident alpha particle or neutron can allow a device to be self-powered. A self-powered particle detector would not need a battery or other power source to operate. Instead, the power needed for the particle detector would be generated by the interaction of the boron carbide semiconductor device with the incident particles.

In an embodiment, a particle detector includes a boron carbide semiconductor device, such as a diode or transistor, that is used to generate an electric current or signal when in the presence of incident particles. The particle detector also includes an electrical connector for transmitting a signal from the boron carbide semiconductor device to another component. For example, a signal generated by the boron carbide semiconductor device could be transmitted by the electrical connector to a display device. In an embodiment, the display device can be a qualitative display device, such as an LED. A qualitative display device only indicates the presence or absence of particles, rather than the number. Alternatively, a quantitative display device can be used, such as a numerical display or a needle that deflects proportionally to the number of particles detected. In still another embodiment, a signal generated by a boron carbide semiconductor device can be transmitted to a data recording device for recording the signals based on the detected incident particles. One example of a data recording device could be a personal computer with a central processing unit, memory, a port for receiving the signals from the particle detector, and software for interpreting the signals. In such an embodiment, the energies of the incident particles could be distinguished and a "pulse height spectrum" recorded.

In another embodiment, prior to a signal being transmitted to a display or recording device, the signal can be amplified. Any convenient amplifier can be used for amplifying the electric signal. A signal transmitted to the amplifier would be amplified and then passed on to the desired display and/or recording device. Similarly, other types of signal processing components or other electric circuitry could be used to process the signals generated by the boron carbide semiconductor device before the signals reach a display or recording device. If present, any of these electric circuit components could be used to form the connection between the electric circuit and the electrical connector of the particle detector.

The particle detector can be enclosed in a outer package, such as an outer package made of an organic polymer. In embodiments involving neutron detection, the outer package can serve as a moderator. Alternatively, the outer package can serve as a protective casing for the device. The outer package can include one or more apertures or openings. The apertures in the outer package can be used to allow exposure of the detector to particles that could not otherwise penetrate the outer package, such as photons and alpha particles. An opening in the outer package can also be used to allow connections between the electrical connector and other components, such as a display or recording device.

Figure 10:
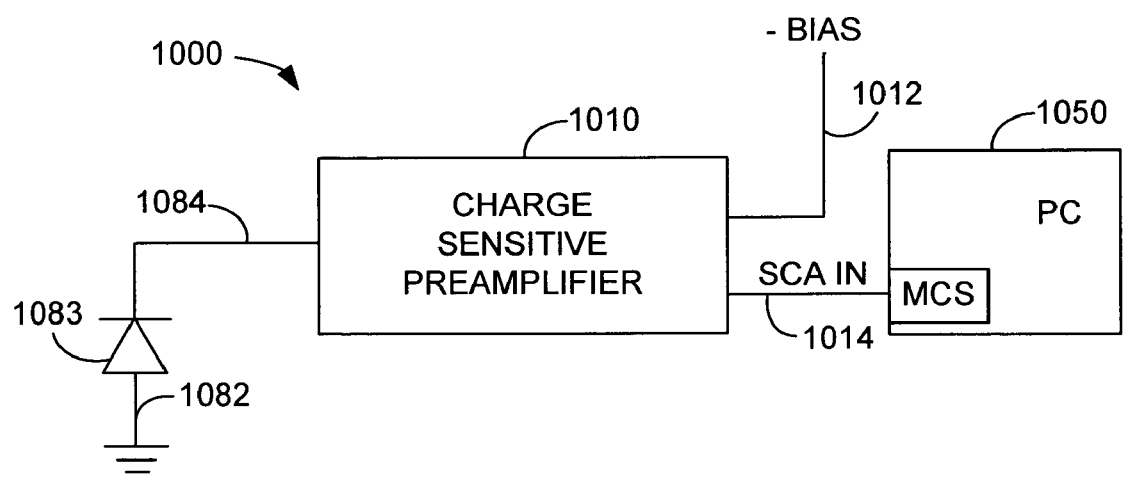
FIG. 10 schematically depicts a particle detector according to an embodiment of the invention.

FIG. 10 provides an example of a particle detector according to an embodiment of the invention. In FIG. 10, a boron carbide diode 1005 is part of an electrical circuit 1000 that is suitable for particle detection. One lead of diode 1005 is connected 1082 to ground. The other lead of diode 1005 is connected 1084 to a preamplifier 1010. Preamplifier 1010 receives electric signals generated when particles are incident on diode 1005. Note that connection 1084 represents an electrical connector for connecting diode 1005 to another component, such as preamplifier 1010. After amplification, the electric signals are transmitted via connection 1014 to a computer 1050, which is shown here as a personal computer. Preamplifier 1010 is also connected 1012 to a negative bias for proper operation.

B. Diode Response to Alpha Particles

The boron carbide diodes according to various embodiments of the invention are sensitive to incident alpha particles. When an alpha particle impinges on the diode, the kinetic energy of the alpha particle is converted into excitation energy for electrons in the diode, resulting in the generation of one or more electron/hole pairs. Unlike a photovoltaic effect, each alpha particle incident on a diode can generate multiple electron/hole pairs. These electron/hole pairs result in a current flow in the boron carbide diode. Note that exposure of a boron carbide diode to alpha particles does not result in damage or decay of the boron carbide diode itself.

In an embodiment, a power generation device based on alpha particles interacting with boron carbide diodes can have a variety of applications. Power generation devices could be used to surround the reactor core of a nuclear reactor in order to take advantage of alpha particles generated by the core. Alternatively, alpha particle power generation devices could be used to power space vehicles or electrical devices in other remote locations. In such an embodiment, a sample of alpha particle-emitting material could be included with the power generation device to allow for continuous power generation. Any suitable alpha particle-emitting material can be used, such as Ra, $^{210}$Po, $^{241}$Am, or $^{244}$Cm. More generally, an alpha particle power generation device coupled with an alpha particle source could be used anywhere that a self-contained, low maintenance power source is desirable. Due to the low penetration depth of alpha particles in most materials, an alpha particle source could be rendered safe with only a minimal amount of shielding.

In an exemplary embodiment, the power generation capability of a boron carbide diode was tested using an alpha particle source. The boron carbide diode was constructed using a PECVD process, such as the process described in connection with FIG. 2. A 0.9 microCurie alpha source of $^{241}$Am was used as the alpha particle source. The alpha particle source was moderated by 1 mm of air. When a surface of the boron carbide diode was exposed to the alpha particle source, the boron carbide diode produced a current of greater than 0.2 mA/cm$^2$ of exposed surface area.

C. Diode Response to Neutron Particles

In another embodiment, devices can also be constructed based on the interaction of neutrons with boron carbide devices. Naturally occurring boron typically contains two isotopes: $^{10}$B and $^{11}$B. The $^{10}$B isotope typically has about a 20% abundance in a boron sample. The $^{10}$B isotope is known to interact with neutrons according to the two following equations:

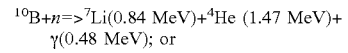

Under either reaction, a boron atom plus a neutron are converted into a lithium atom plus a helium nucleus (or alphaparticle). This reaction allows a boron-containing compound to serve as a neutron detector, due in part to the large amount of energy produced by the reaction.

In an embodiment, the boron carbide diodes of this invention can be used to form a neutron detector and/or a power generation device based on neutron absorption. When exposed to incident neutrons, the boron carbide diodes of this invention are capable of direct generation of electric current. In addition to the current generated by a neutron impinging on the detector, the neutron absorption process also results in the ejection of an alpha particle, which is the nucleus of the helium-4 atom. Thus, a boron carbide diode can generated additional electrical energy due to interaction with the ejected helium atom.

Figure 9:
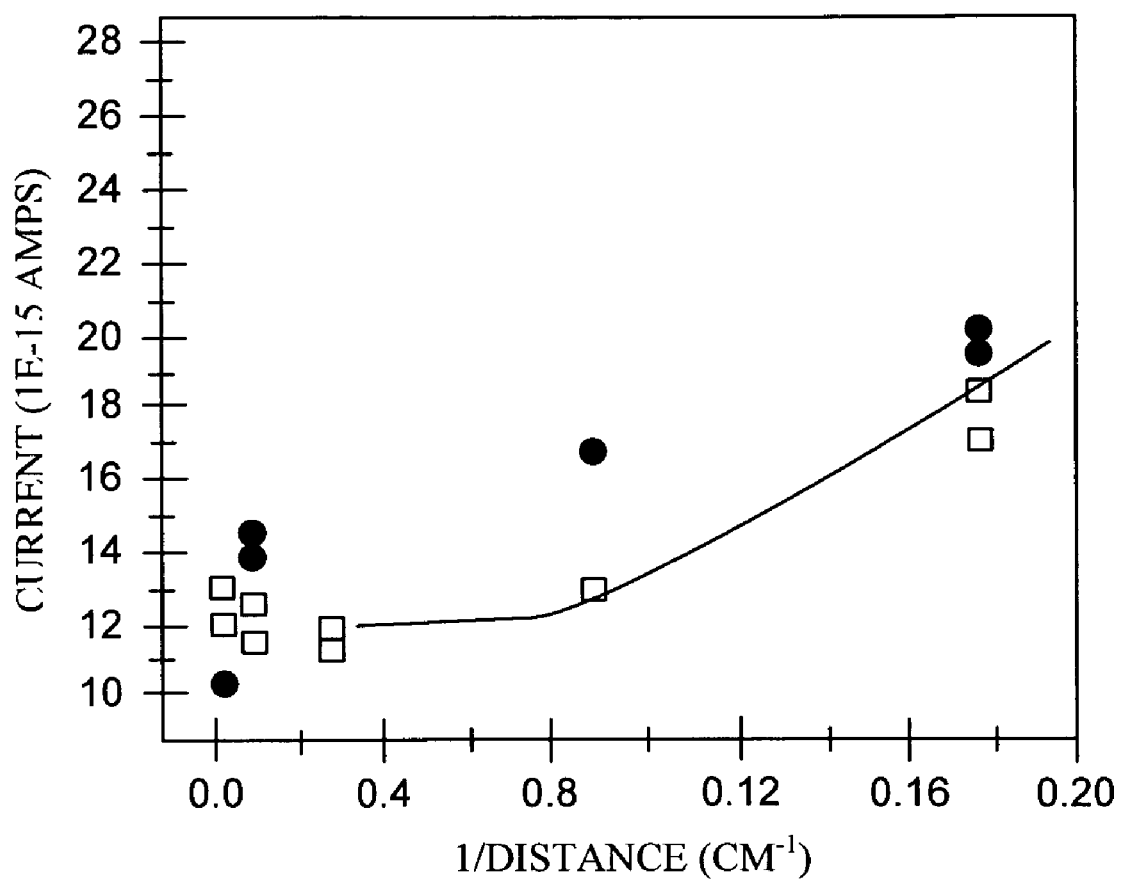
FIG. 9 depicts various properties of boron carbide devices according to an embodiment of the invention.

FIG. 9 shows an exemplary embodiment where current was generated in a boron carbide diode as a result of an incident flow of neutrons. At the closest point of approach to the neutron source, the boron carbide diode was subjected to an incident neutron flux of approximately 120 neutrons/sec. The current generated by incident neutrons is shown relative to 1/d, where d is the distance from the boron carbide diode to the neutron source. As shown in FIG. 9, current is produced at both zero bias (the square data points) and at a reverse bias of 5 V (the filled circles).

In another exemplary embodiment, the power generation capability of a boron carbide diode was tested using a neutron source. The boron carbide diode was constructed using a PECVD process, such as the process described in connection with FIG. 1. A low-fluence Pu—Be source moderated with 25 cm of paraffin was used as the neutron source. The incident flux of neutrons on the boron carbide diode was on the order of 670 neutrons/cm$^2$*sec. When a surface of the boron carbide diode was exposed to the neutron source, the boron carbide diode produced a current of greater than 0.1 mA/cm² of exposed surface area.

In still another embodiment, the power generation of a boron carbide diode can be further increased by using boron with a higher percentage of $^{10}$B. Typical natural occurring samples of boron contain approximately 20% $^{10}$B. However, $^{10}$B can be isolated and used to form boron carbide layers having higher $^{10}$B contents. For example, in an embodiment where boron carbide layers are deposited using PECVD, the carborane source used to form p-type and n-type layers can have an enriched amount of $^{10}$B.

Although $^{10}$B interacts with incident neutrons, the incident neutrons still have a finite penetration depth. As the number and energy of the incident neutrons increases, the penetration depth of the neutrons will also increase. Thicker diodes and/or stacks of multiple diodes can be used to take advantage of larger neutron penetration depths, allowing for increased energy conversion. In an embodiment, a stack of two or more boron carbide diodes can be used, with the p-n junctions of the diodes oriented perpendicular to the expected incident direction of the neutron flux. In another embodiment, layers of stacked diodes can be can be arranged concentrically to surround a neutron source.

The principles and modes of operation of this invention have been described above with reference to various exemplary and preferred embodiments. As understood by those of skill in the art, the overall invention, as defined by the claims, encompasses other preferred embodiments not specifically enumerated herein.

What is claimed is:

1. A particle detector, comprising:
    a boron carbide semiconductor device having at least one heteroisomer junction, the boron carbide semiconductor device comprising:
        a layer composed of a first isomer of boron carbide:
        a layer composed of a second isomer of boron carbide, the layer composed of the second isomer of boron carbide being deposited on the layer composed of the first isomer;
        a third layer composed of the first isomer of the semiconducting material, for construction of a bipolar junction transistor, the third layer being deposited on the layer composed of the second isomer;
    an electrical connector for transmitting a signal generated by the boron carbide semiconductor device; and
    at least one of a display device and a data recording device configured to receive a signal transmitted from the electrical connector.

2. The particle detector, comprising:
    a boron carbide semiconductor device having at least one heteroisomer junction, the boron carbide semiconductor device comprising:
        a layer composed of a first isomer of boron carbide:
        a layer composed of a second isomer of boron carbide, the layer composed of the second isomer of boron carbide being deposited on the layer composed of the first isomer;
        a third layer composed of a third isomer of the semiconducting material, for construction of a bipolar junction transistor, the third layer being deposited on the layer composed of the second isomer;
    an electrical connector for transmitting a signal generated by the boron carbide semiconductor device; and
    at least one of a display device and a data recording device configured to receive a signal transmitted from the electrical connector.

3. The particle detector of claim 2, wherein the first isomer is formed by decomposition of metacarborane or paracarborane and the second isomer is formed by decomposition of orthocarborane.

4. The particle detector of claim 1, wherein the layer from first isomer of the boron carbide is a p-type material and the layer from second isomer is an n-type material.

5. The particle detector of claim 1, wherein the layer from first isomer of the boron carbide is an n-type material and the layer from second isomer is a p-type material.

6. The particle detector of claim 1, wherein the layer composed of the first isomer is formed by decomposition of orthocarborane, metacarborane, or paracarborane.

7. The particle detector of claim 1, further comprising:
    an electrical connection layer formed on a surface of the layer composed of the first isomer;
    a second electrical connection layer formed on a second surface of the layer composed of the first isomer; and
    a base connection layer formed on a surface of the layer composed of the second isomer.

* * * * *